US009325052B2

(12) United States Patent
Peroulis et al.

(10) Patent No.: US 9,325,052 B2
(45) Date of Patent: Apr. 26, 2016

(54) TUNABLE CAVITY RESONATOR HAVING A POST AND VARIABLE CAPACITIVE COUPLING

(71) Applicant: Purdue Research Foundation, West Lafayette, IN (US)

(72) Inventors: Dimitrios Peroulis, West Lafayette, IN (US); Akash Anand, Davis, CA (US); Joshua Azariah Small, Lexington Park, MD (US); Xiaoguang Liu, West Lafayette, IN (US); Muhammad Shoaib Arif, West Lafayette, IN (US); Mihal Sinani, West Lafayette, IN (US)

(73) Assignee: Purdue Research Foundation Regents of the University of California, West Lafayette, IN (US)

( * ) Notice: Subject to any disclaimer, the term of this patent is extended or adjusted under 35 U.S.C. 154(b) by 129 days.

(21) Appl. No.: 13/907,436

(22) Filed: May 31, 2013

(65) Prior Publication Data

US 2013/0335173 A1     Dec. 19, 2013

Related U.S. Application Data

(60) Provisional application No. 61/654,568, filed on Jun. 1, 2012.

(51) Int. Cl.
| | |
|---|---|
| *H01P 7/04* | (2006.01) |
| *H01P 7/06* | (2006.01) |
| *B81B 7/02* | (2006.01) |
| *H01P 7/08* | (2006.01) |
| *H01P 7/10* | (2006.01) |

(52) U.S. Cl.
CPC ... *H01P 7/04* (2013.01); *B81B 7/02* (2013.01); *H01P 7/06* (2013.01); *H01P 7/088* (2013.01); *H01P 7/10* (2013.01)

(58) Field of Classification Search
CPC .......... H01P 1/205; H01P 1/2053; H01P 7/04
USPC .......................................... 333/203, 223, 235
See application file for complete search history.

(56) References Cited

U.S. PATENT DOCUMENTS

| 4,380,747 A * | 4/1983 | Curtinot et al. ............... 333/202 |
| 5,130,673 A * | 7/1992 | McJunkin ....................... 331/96 |
| 2011/0032054 A1* | 2/2011 | Park et al. ..................... 333/203 |

OTHER PUBLICATIONS

Rosa, M. A., D. D. Bruyker, A.R Volkel, E. Peeters and J. Dunec, A Novel External Electrode Configuration for the Electrostatic Actuation of MEMS Based Devices, in J. Micromech. Microeng., vol. 14, No. 4, pp. 446-451, Apr. 2004.
Liu, X., J. Small, D. Berdy, L. P. B. Katehi, W. J. Chappell and D. Peroulis, Impact of Mechanical Vibration on the Performance of RF MEMS Evanescent-Mode Tunable Resonators, IEEE Microw. Wireless Compon. Lett., vol. 21, No. 8, pp. 406-408, Aug. 2011.

(Continued)

*Primary Examiner* — Benny Lee
(74) *Attorney, Agent, or Firm* — Maginot, Moore & Beck LLP

(57) ABSTRACT

A tunable cavity resonator includes a housing, a post, and a controllably variable capacitive coupling. The housing defines an interior and has at least one side wall, a first end, and a second end. The post is located within the interior and extends from the first end to the second end. The post and the housing define a resonating cavity. The controllably variable capacitive coupling is disposed in the housing.

20 Claims, 10 Drawing Sheets

(56) References Cited

OTHER PUBLICATIONS

Garg, A., J. Small, A. Mahapatro, X. Liu, D. Peroulis, Impact of Sacrificial Layer Type on Thin Film Metal Residual Stress, IEEE Sensors, Oct. 2009, pp. 1052-1055.

Small, J., W. Irshad, and D. Peroulis, A Fast High-Q X-Band RF-MEMS Reconfigurable Evanescent-Mode Cavity Resonator, 2012 IEEE MTT-S Int. Microw. Symp. Tech. Dig., Accepted.

Joshi, H., H. H. Sigmarsson, D. Peroulis, and W. J. Chappell, Highly Loaded Evanescent Cavities for Widely Tunable High-Q Filters, in 2007 IEEE MTT-S Int. Microw. Symp. Tech. Dig., Jun. 2007, pp. 2133-2136.

Moon, S., H. Sigmarsson, H. Joshi, and W. J. Chappell, Substrate Integrated Evanescent-Mode Cavity Filter with a 3.5 to 1 Tuning Ratio, IEEE Microw. Wireless Compon. Lett., vol. 20, No. 8, pp. 450-452, Aug. 2010.

Rebeiz, G. M., K. Entesari, I. C. Reines, S. Park, M. A. El-Tanani, A. Grichener and A. R. Brown, Tuning in to RF MEMS, IEEE Microwave Mag., vol. 10, No. 6, pp. 55-72, Sep. 2009.

Liu, X., L.P.B. Katehi, W.J. Chappell and D. Peroulis, High-Q Tunable Microwave Cavity Resonators and Filters Using SOI-Based RF MEMS Tuners, J. Microelectromech. Syst, vol. 19, No. 4, pp. 774-784, Aug. 2010.

Liu, X., L. P. B. Katehi, W. J. Chappell, and D. Peroulis, A 3.4-6.2 GHz Continuously Tunable Electrostatic MEMS Resonator with Quality Factor of 460-530, in 2009 IEEE MTT-S Int. Microw. Symp. Tech. Dig., Boston, MA, Jun. 2009, pp. 1149-1152.

Irshad, W. and D. Peroulis, A 12-18 GHz Electrostatically Tunable Liquid Metal RF MEMS Resonator with Quality Factor of 1400-1840, 2011 IEEE MTT-S Int. Microw. Symp. Tech. Dig., Baltimore, MD, Jun. 2011, doi: 10.1109/MWSYM.2011.5972971.

Arif, M. S., W. Irshad, X. Liu, W. J. Chappell, and D. Peroulis, A High-Q Magnetostatically-Tunable All-Silicon Evanescent Cavity Resonator, 2011 IEEE MTT-S Int. Microw. Symp. Tech. Dig., Baltimore, MD, Jun. 2011, doi: 10.1109/MWSYM.2011.5972966.

Arif, M. S. and D. Peroulis, A 6 to 24 GHz Continuously Tunable, Microfabricated, High-Q Cavity Resonator with Electrostatic Mems Actuation, 2012 IEEE MTT-S Int. Microw. Symp. Tech. Dig., Accepted.

Stefanini, R., Jorge D. Martinez, M. Chatras, A. Pothier, V. E. Boria and P. Blondy, Ku Band High-Q Tunable Surface-Mounted Cavity Resonator Using RF MEMS Varactors, IEEE Microw. Wireless Compon. Lett., vol. 21, No. 5, pp. 237-239, May 2011.

Park, S.J., I. Reines, C. Patel and G. M. Rebeiz, "High-Q RF-MEMS 4-6 GHz Tunable Evanescent-Mode Cavity Filter", IEEE Trans. Microw. Theory Tech., vol. 58, No. 2, pp. 381-389, Feb. 2010.

Gong, S., T. Reck, and N. S. Barker, A Temperature Insensitive DC Contact RF-MEMS Switch, in 40th European Microwave Conference, Paris, France, 2010, pp. 1114-1117.

Patel, C. D. And G. M. Rebeiz, A High Power (>5 W) Temperature Stable RF-MEMS Metal-Contact Switch with Orthogonal Anchors and Force-Enhancing Stoppers, 2011 IEEE MTT-S Int. Microw. Symp. Tech. Dig., Baltimore, MD, Jun. 2011, doi:10.1109/MWSYM.2011.5972717.

Park, S. J., M. A. El-Tanani, I. Reines and G. M. Rebeiz, Low loss 4-6 GHz Tunable Filter with 3-bit High-Q Orthogonal Bias RF-MEMS Capacitance Network, IEEE Trans. Microw. Theory Tech., vol. 56, No. 10, pp. 2348-2355, Oct. 2008.

* cited by examiner

TUNABLE CAVITY RESONATOR HAVING A POST AND VARIABLE CAPACITIVE COUPLING

This application claims the benefit of priority of U.S. provisional application Ser. No. 61/654,568, filed Jun. 1, 2012, the disclosure of which is incorporated by reference herein in its entirety.

FIELD

The present disclosure relates to cavity resonators for electromagnetic signals and, in particular, to a tunable cavity resonator that includes a tuning assembly having a plurality of components configured to tune a resonant frequency of the cavity resonator.

BACKGROUND

Tunable cavity resonators are electronic components that are useable as filters for radio frequency electromagnetic signals, among other types of signals. In particular, tunable cavity resonators using the evanescent mode cavity-based implementation are effective filters that are low-loss and widely tunable. Additionally, cavity resonators using the evanescent mode implementation typically offer a good balance between filter size, signal loss, spurious-free dynamic range, and tuning range.

Tunable cavity resonators typically include either a piezoelectric or an electrostatic microelectromechanical systems ("MEMS") tuning device. Piezoelectrically-tuned cavity resonators typically yield excellent radio frequency filtering results. These types of tuning devices, however, are typically large, with a diameter of approximately twelve to thirteen millimeters, and have slow response speeds that are on the order of one millisecond or more. MEMS electrostatically-tuned cavity resonators also typically yield excellent radio frequency filtering results; however, the aggressive electromechanical designs of known devices suffer from a low unloaded quality factor ("$Q_u$") due to effects from the biasing network that is used to control the MEMS tuner. Accordingly, known tuning devices for cavity resonators exhibit a tradeoff between size, unloaded quality factor, frequency tuning, tuning speed, and complexity of assembly.

As a consequence, further developments based on one or more of the above-described limitations are desirable for tunable cavity resonators.

SUMMARY OF THE INVENTION

According to one embodiment of the present disclosure, a tunable cavity resonator includes a housing, a post, and a controllably variable capacitive coupling. The housing defines an interior and has at least one side wall, a first end, and a second end. The post is located within the interior and extends from the first end to the second end. The post and the housing define a resonating cavity. The controllably variable capacitive coupling is disposed in the housing.

According to another embodiment of the present disclosure, a tunable cavity resonator includes a substrate, a cap structure, a post structure, and a capacitive tuning assembly. The cap structure extends from the substrate. At least one of the substrate and the cap structure defines a resonator cavity. The post structure is at least partially located within the resonator cavity and extends from the substrate to the cap structure. The post structure defines a post impedance. The capacitive tuning assembly is connected to the cap structure and is spaced apart from the post structure. The capacitive tuning assembly defines a tuning assembly capacitance. The tuning assembly is configured to controllably tune the tuning assembly capacitance between a first tuning capacitance and a second tuning capacitance. A resonant frequency of the tunable cavity resonator is based on the tuning assembly capacitance and the post impedance.

According to yet another embodiment of the present disclosure, a tunable cavity resonator includes a substrate, a cap structure, a post structure, and a capacitive tuning assembly. The cap structure extends from the substrate. At least one of the substrate and the cap structure defines a resonator cavity. The cap structure includes a first portion spaced apart from a second portion by a gap space. The post structure extends between the substrate and the first portion of the cap structure. The post structure defines a post impedance. The capacitive tuning assembly includes a plurality of tuning components at least partially located in the gap space. The capacitive tuning assembly defines a tuning assembly capacitance, and is configured to controllably tune the tuning assembly capacitance between a first tuning capacitance and a second tuning capacitance. A resonant frequency of the tunable cavity resonator is based on the tuning assembly capacitance and the post impedance.

DETAILED DESCRIPTION OF THE INVENTION

In the following description, it will be appreciated that multiple drawings may show different views of the same devices. Like features in such different drawings are designated by the same reference label, and may not be described in each instance where they appear.

Figure 1:
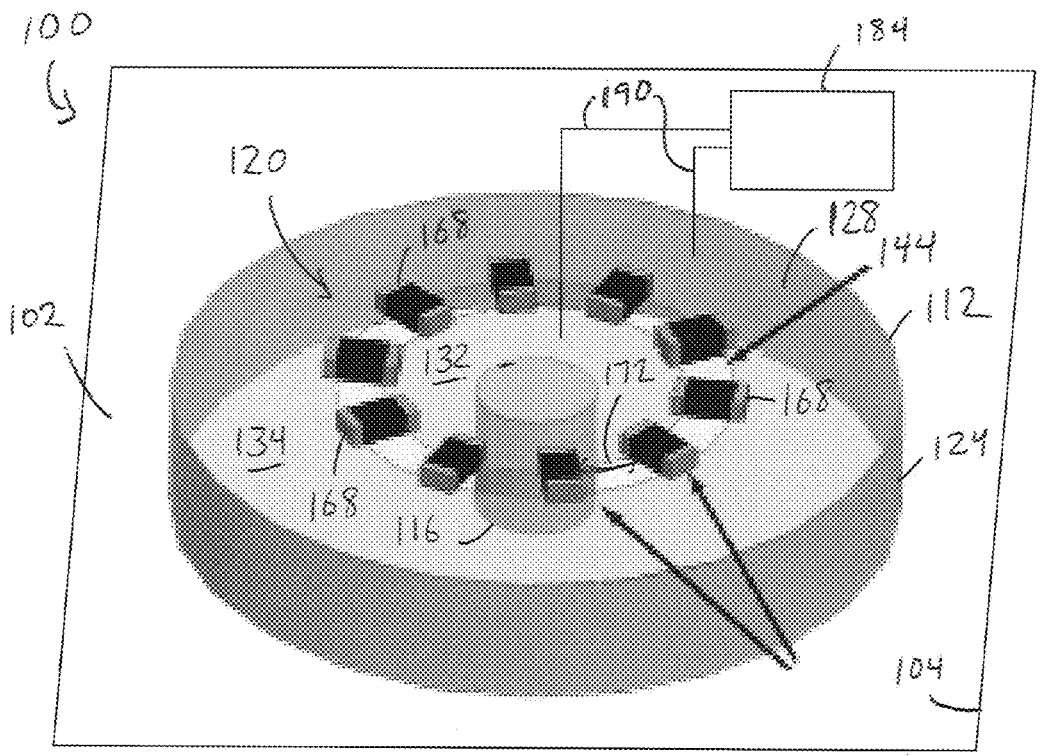
FIG. 1 is perspective view of a cavity resonator as described herein.
Figure 2:
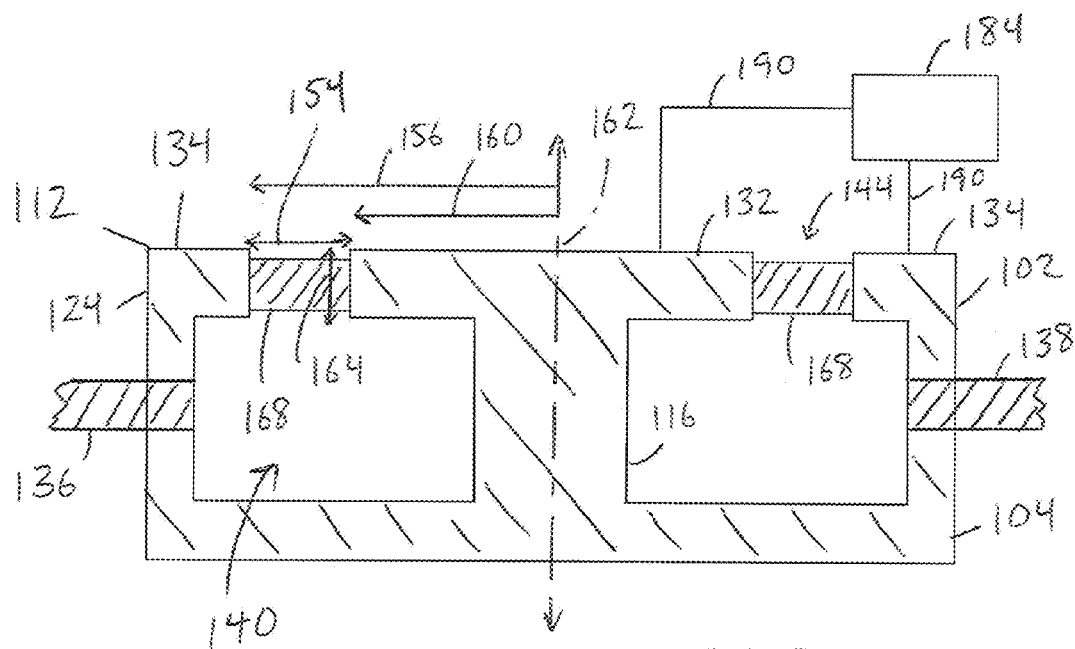
FIG. 2 is a cross sectional view of the cavity resonator of FIG. 1.

As shown in FIGS. 1 and 2, a tunable cavity resonator 100 (FIG. 1) includes a housing 102 formed from a substrate 104 and a cap structure 112, an evanescent post 116, and a tuning assembly 120 (FIG. 1). The substrate 104 defines an end of the housing 102 and is formed from high resistivity silicon. In one embodiment, the substrate 104 has a resistivity of approximately 10 kΩ-cm and has a thickness of approximately five millimeters. In another embodiment the substrate 104 is formed from quartz or any other suitable substrate material (conductive or non-conductive), as desired by those of ordinary skill in the art.

The cap structure 112 extends from the substrate 104 and is also formed from silicon. The cap structure 112 includes a hollow-cylindrical sidewall 124 that extends from the substrate 104 and a circular ceiling 128 (FIG. 1) extending from the sidewall. The sidewall 124 extends approximately perpendicularly from the substrate 104. The ceiling 128 is spaced apart from the substrate 104 and includes a radially inner ceiling portion 132 (FIG. 2) that is spaced apart from a radially outer ceiling portion 134 (FIG. 2). The ceiling 128 defines a first end of the housing 102 that is spaced apart from a second end of the housing, which is defined by the substrate 104.

With reference to FIG. 2, the cap structure 112 further includes an input lead 136 and an output lead 138 coupled to the sidewall 124. The input lead 136 and the output lead 138 are shorted coplanar waveguide ("CPW") transmission lines, but may be any suitable signal transmission line, as desired by those ordinary skill in the art.

The substrate 104 and the cap structure 112 define an interior of the housing, which is referred to herein as a resonator cavity 140. The resonator cavity 140 is a substantially hollow-cylinder shaped cavity. The volume and shape of the resonator cavity 140 contributes in part to establishing a resonate frequency of the cavity resonator 100. An exemplary resonator cavity 140 defines a radius of approximately twelve millimeters and a height of approximately four millimeters. The resonator cavity 140 is lined with an electrically conductive material, such as gold.

The cap structure 112 further defines a gap space 144, which is a ring-shaped void located between the radially inner ceiling portion 132 and the radially outer ceiling portion 134. The gap space 144 is shaped as a hollow cylinder and defines a width 154. The width 154 is equal to a difference between an outer ceiling radius 156 and an inner ceiling radius 160, as measured from a center 162 of the evanescent post 116. A height 164 of the gap space 144 is approximately equal to a thickness of the ceiling 128. The gap space 144 is in fluid communication with the resonator cavity 140. In the illustrated embodiment, the width 154 is approximately five millimeters and the height 164 is approximately two millimeters. In another embodiment, the cap structure 112 defines more than one concentrically arranged gap space.

The evanescent post 116, which is also referred to herein as a post structure or as a post, is located within the resonator cavity 140. The evanescent post 116 extends from the substrate 104 to the radially inner ceiling portion 132 of the cap structure 112. The evanescent post 116 defines a shape that is substantially cylindrical. An exemplary evanescent post 116 has a radius of 0.4 millimeters. The evanescent post 116 is formed from silicon coated with an electrically conductive material, such as gold. Alternatively, the evanescent post 116 is formed from metal such as copper.

Figure 3:
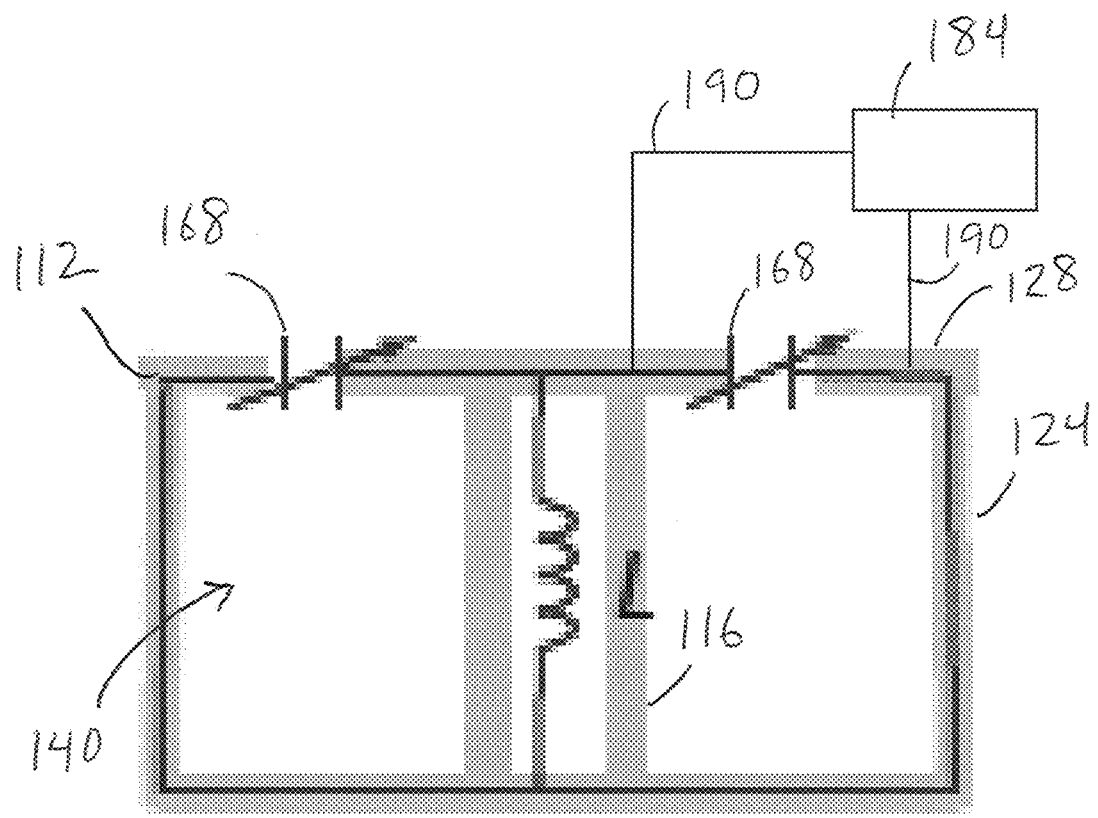
FIG. 3 is a block diagram cross sectional view of the cavity resonator of FIG. 1 showing an impedance of a tuning assembly and an impedance of an evanescent post of the cavity resonator.

As shown in FIG. 3, the evanescent post 116 defines a post impedance. In the illustrated embodiment, the post impedance is substantially inductive. The magnitude of the post impedance is based on the size, shape, and material(s) of the evanescent post 116. The resonant frequency of the cavity resonator 100 (FIG. 1) is partially based on the post impedance.

With reference again to FIGS. 1 and 2, the tuning assembly 120 (FIG. 1), which is also referred to herein as a controllably variable capacitive coupling, is connected to the cap structure 112 in a location that is spaced apart from the evanescent post 116. In the illustrated embodiment, the tuning assembly 120 disposed in the housing 102. Specifically, the tuning assembly 120 is disposed in the gap space 144 formed in the first end (i.e. the ceiling 128) of the housing.

The tuning assembly 120 includes a plurality of tuning components 168. The tuning assembly 120 is shown as including ten of the tuning components 168; however, in other embodiments the tuning assembly includes between one and one hundred of the tuning components. The number of tuning components 168 is selected to fill the gap space 144 so that current crowding is limited.

The tuning components 168 are located a radial distance (see inner radius 160, FIG. 2) from the center of the evanescent post 116. The tuning components 168 are arranged in a circular array and are evenly spaced apart from each other by a uniform arc length distance 172 (FIG. 1). In FIG. 2, the tuning components 168 are shown as being completely positioned in the gap space 144; however, in other embodiments the tuning components extend above the gap space and/or below the gap space into the resonator cavity 140.

As shown in FIG. 3, the tuning components 168 are connected in parallel between the radially inner ceiling portion 132 and the radially outer ceiling portion 134 as shown in FIGS. 1 and 2, and are configured to exhibit a tunable component impedance. In particular, the tuning components 168 are configured to be tuned between a first component impedance and a second component impedance. The component impedance in the illustrated embodiment is capacitive; accordingly, the tuning components 168 exhibit a controllably variable capacitance that is tunable between a first capacitance and a second capacitance.

The tuning components 168 in one embodiment include lumped element solid state varactor diodes, which are provided as surface mount components. The tuning components 168 exhibit a controllably variable capacitance, as described above, and define an internal resistance. An exemplary internal resistance ("Rb") of the tuning components 168 is 0.2 to 1 ohms. The internal resistance of the tuning components 168 contributes to a reduction in the unloaded quality factor ("$Q_u$") of the cavity resonator 100, and therefore should typically be limited. The tuning components 168 in the illustrated embodiments, are also referred to herein as varactor diodes, varicap diodes, variable capacitance diodes, variable reactance diodes, and tuning diodes.

The tuning components 168, in other embodiments, are provided as any element that is configured to exhibit a controllably variable (i.e. tunable) impedance. Accordingly, the other exemplary tuning components 168 include, but are not limited to, MEMS tuners, MEMS varactors, ferroelectric variable capacitors (i.e. barium strontium titanate variable capacitors), carbon nanotube components, graphine components, and any combination of these or other tunable components, as desired by those of ordinary skill in the art. Each of such components is electrically controllable such that when coupled in or about the gap space 144, the components provide a variable capacitive coupling between the radially inner ceiling portion 132 and the radially outer ceiling portion 134 in response to a suitable control signal.

The component impedances of the tuning components 168 combine to define a tuning assembly impedance of the tuning assembly 120. As shown in FIG. 3, the tuning assembly impedance, which is capacitive, is in series with the post impedance, which is inductive. In the illustrated embodiment, the tuning assembly impedance is tunable from 0.1 to 5.5 pF.

The resonant frequency of the cavity resonator 100 is partially based on the tuning assembly impedance.

As shown in FIG. 1, the cavity resonator 100 further includes a tuning network 184 and a DC biasline 190. The tuning network 184 is electrically connected to the tuning components 168 by the DC biasline 190 and is spaced apart from the resonator cavity 140. The tuning network 184 is connected to the substrate 104; however, in other embodiments, the tuning network is connected to the cap structure 112 or to another element.

The tuning network 184 is configured to generate a controllable tuning signal, also referred to herein as a drive signal, that is configured to controllably tune the impedance of the tuning assembly 120. The tuning signal is a DC signal of controllably variable magnitude. In another embodiment, the tuning signal is based on the type of signal required by the type of tuning components 168 of the tuning assembly 120. Accordingly, in one embodiment the tuning signal is an AC signal having a controllably variable frequency, magnitude, or phase. Alternatively, in yet another embodiment the tuning signal is a digital signal having a controllably variable duty cycle, pulse width, or the like.

The DC biasline 190 connects the tuning network 184 to the radially inner ceiling portion 132 and to the radially outer ceiling portion 134. Accordingly, DC biasline 190 is configured to couple the tuning signal across the tuning components 168.

In operation, the cavity resonator 100 functions similarly to a bandpass filter by intensifying a range of frequencies of an input radio frequency electromagnetic signal. The range of frequencies that is intensified is centered about the resonant frequency of the cavity resonator 100. In order to intensify a different range of frequencies, the cavity resonator 100 is tuned using the tuning network 184 and the tuning assembly 120, which changes the resonant frequency of the cavity resonator 100 by changing the total impedance exhibited by the combination of the tuning assembly 120 and the evanescent post 116.

The tuning network 184 controllably varies the impedance of the tuning components 168 of the tuning assembly 120 by generating a tuning signal having a magnitude that corresponds to a desired tuning assembly impedance. In the illustrated example, the tuning components 168 are provided as varactors having a controllably variable capacitance. In response to receiving the tuning signal, the varactors are reversed biased. The magnitude of the voltage applied to the varactors is directly related to the thickness of a depletion zone of the varactors, with an increase in voltage magnitude causing an increase in the thickness of the depletion zone. The capacitance exhibited by the varactors is inversely related to the depletion zone thickness. Accordingly, increasing the voltage magnitude of the tuning signal decreases the tuning assembly capacitance and decreasing the magnitude of the tuning signal increases the tuning assembly capacitance. Substantially, no current is drawn from the tuning network 184 by the varactors. The tuning assembly capacitance is combined with the impedance of the evanescent post 116 to determine the resonate frequency of the tunable cavity resonator 100.

Figure 4:
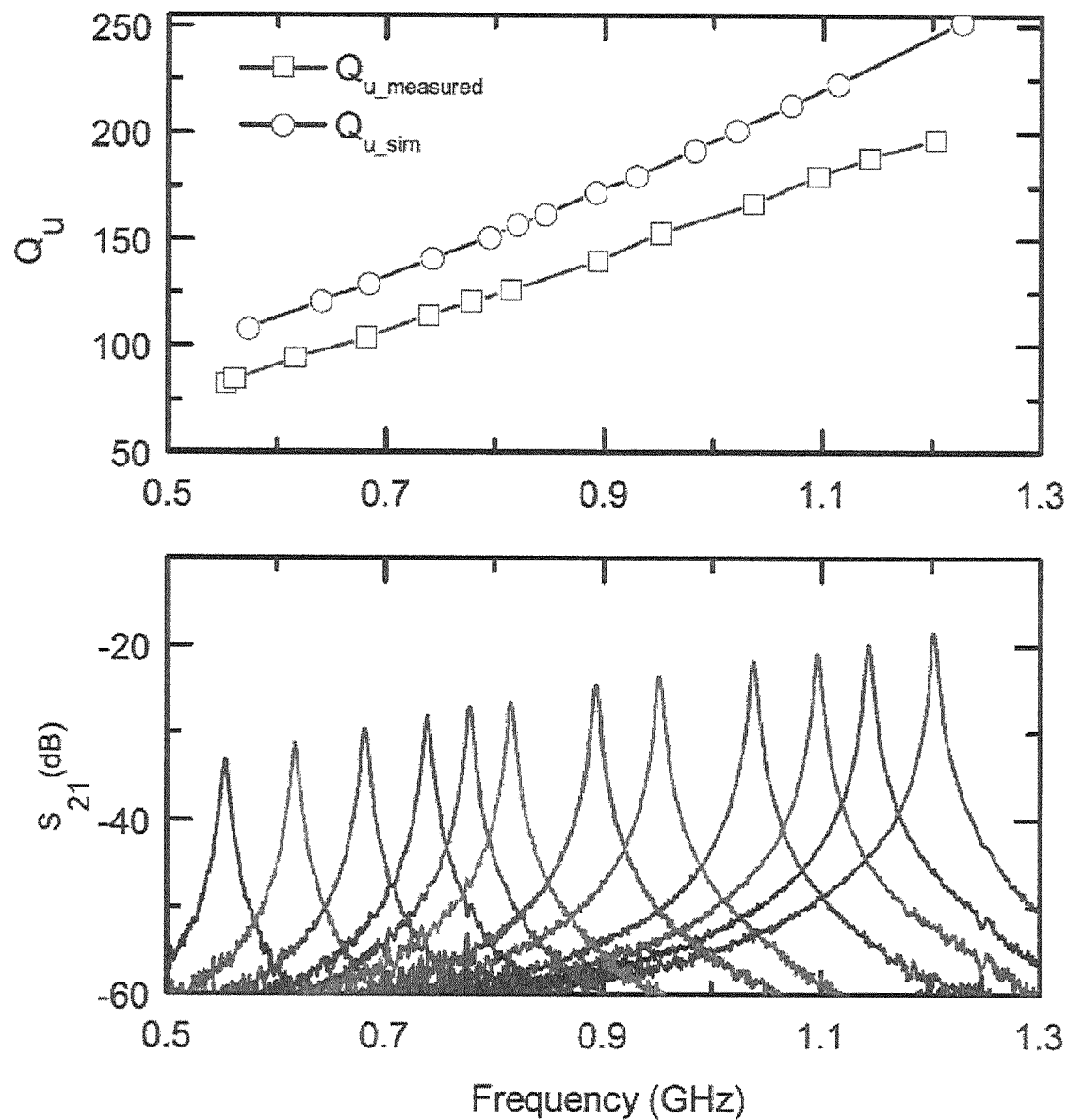
FIG. 4 includes a first graph showing the measured and simulated unloaded quality factor ("$Q_u$") of the cavity resonator of FIG. 1, and a second graph showing the measured frequency tuning range of the cavity resonator of FIG. 1.

As shown in FIG. 4, the extracted $Q_u$ for a frequency range in GHz and the measured frequency response $S_{21}$(db) for a frequency range in GHz is shown for the cavity resonator 100. In generating the results of FIG. 4, the cavity resonator 100 was intentionally weakly coupled so that $Q_u$ extraction could be achieved with high accuracy. A measured $Q_u$ of 197-82 from 1.2-0.5 GHz (tuning ratio of 2.4:1) with a bias of thirty-one volts is demonstrated. The measured $Q_u$ is within 22% of the eigenmode simulation results. From these results it is noted that the $Q_u$ of the cavity resonator 100 can be increased by increasing the finite quality factor ("Q") of the components.

The cavity resonator 100 exhibits numerous benefits. One of the benefits is the flexibly in selecting the tuning components 168 of the tuning assembly 120. The tuning components 168 are shown as solid state varactor diodes, but as described above, in other embodiments the tuning components are provided as any component that exhibits a controllably variable impedance.

Another benefit of the cavity resonator 100 is that a starting resonant frequency and a tuning range are easily determined. In comparison, the starting resonant frequency and the tuning range of prior art cavity resonators is typically determined by the particular dimensions of the resonator cavity and the evanescent post. Specifically, frequency tuning in prior art cavity resonators is achieved by changing a gap distance between the evanescent post and a ceiling of the resonator cavity. To achieve the desired capacitance value, vertical alignment with a precision of well below one micrometer is typically required. Whereas, with the cavity resonator 100, the starting resonate frequency and the tuning range are determined primarily by characteristics (i.e. the impedance) of the tuning components 168. Accordingly, the cavity resonator 100 is simpler and potentially less expensive to manufacture since the starting resonant frequency and the tuning range are more easily and accurately determined.

Yet another benefit of the cavity resonator 100 is that the resonator is integrated in an industry-standard printed circuit board ("PCB") substrate with commercially-available tuning components 168, thereby facilitating high-volume manufacturing, ease of integration with other RF front-end components, and lower fabrication cost. Compared with planar designs, such as microstrip resonators/filters, the proposed design retains the high $Q_u$ of cavity resonators.

Figure 5:
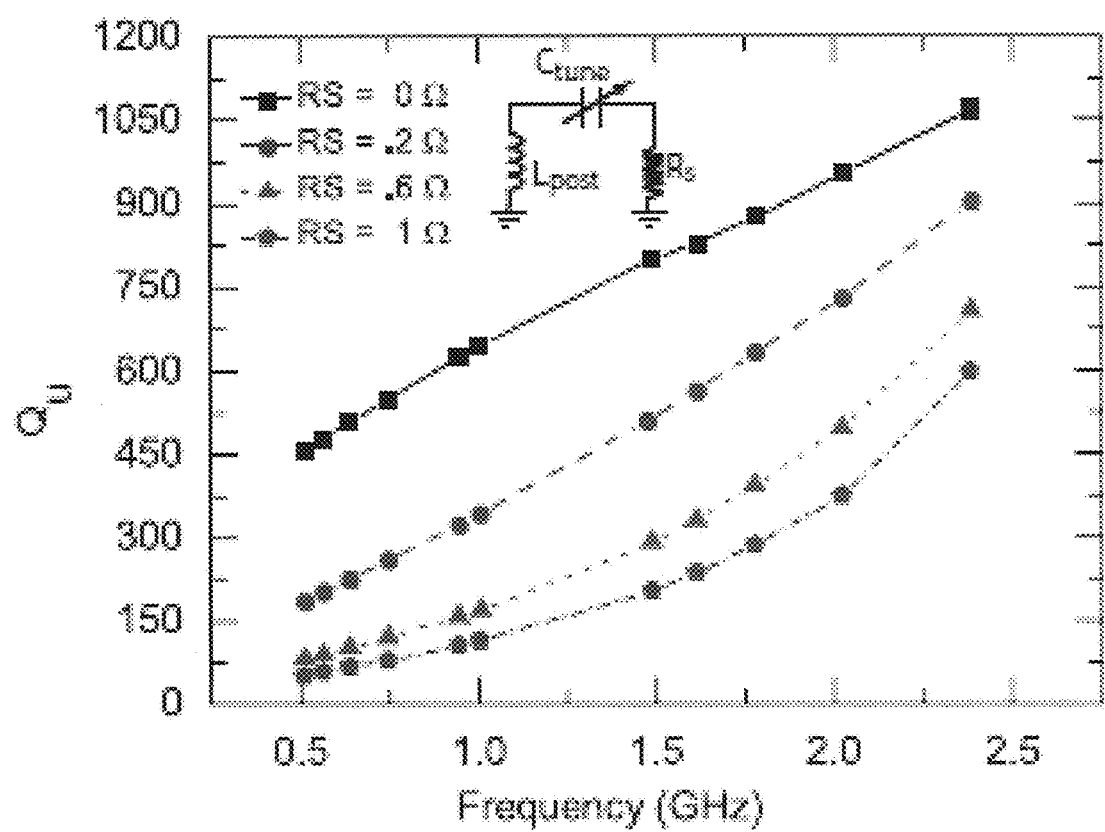
FIG. 5 is a graph of the unloaded quality factor ("$Q_u$") verses frequency for various tunable components that are usable with the cavity resonator of FIG. 1.

As shown in FIG. 5, full wave electromagnetic simulation software was used to illustrate the impact of the loss of the tuning components on the $Q_u$ of the cavity resonator 100. A "lumped RLC" boundary condition was used to model the inductive post $L_{post}$ in conjunction with lumped element varactors with both a $C_{tune}$ and an $R_s$ value, which represent the Q of the varactors. In FIG. 4, the results are shown for a simulated $Q_u$ with $C_{tune}$ from 0.1 to 5.5 pF and $R_s$ of 0.2 to 1 ohms with a total of twenty of the components 168. The results illustrated in FIG. 5 indicate that reducing the internal resistance $R_s$ of the components 168 from 1 Ω to 0 Ω results in an increase in the $Q_u$, across the simulated frequency range of 0.5 to 2.5 GHz.

Figure 6:
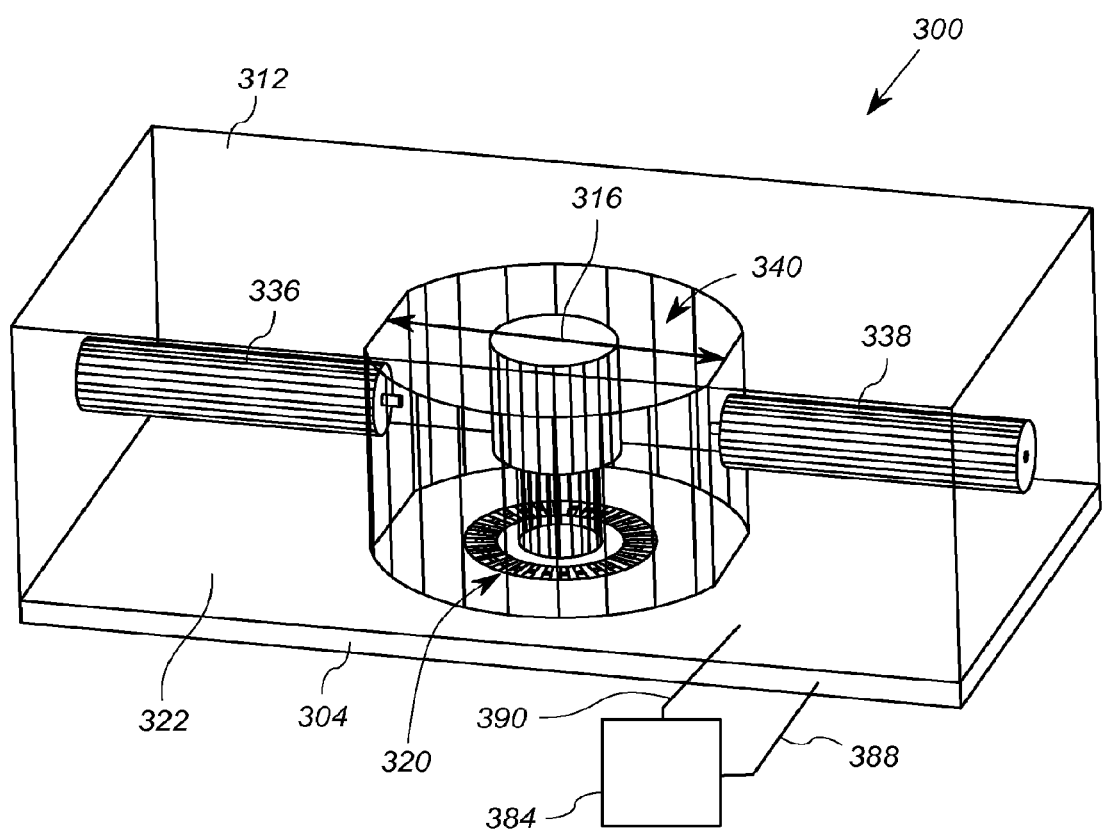
FIG. 6 is a perspective view of another embodiment of the cavity resonator of FIG. 1.
Figure 7:
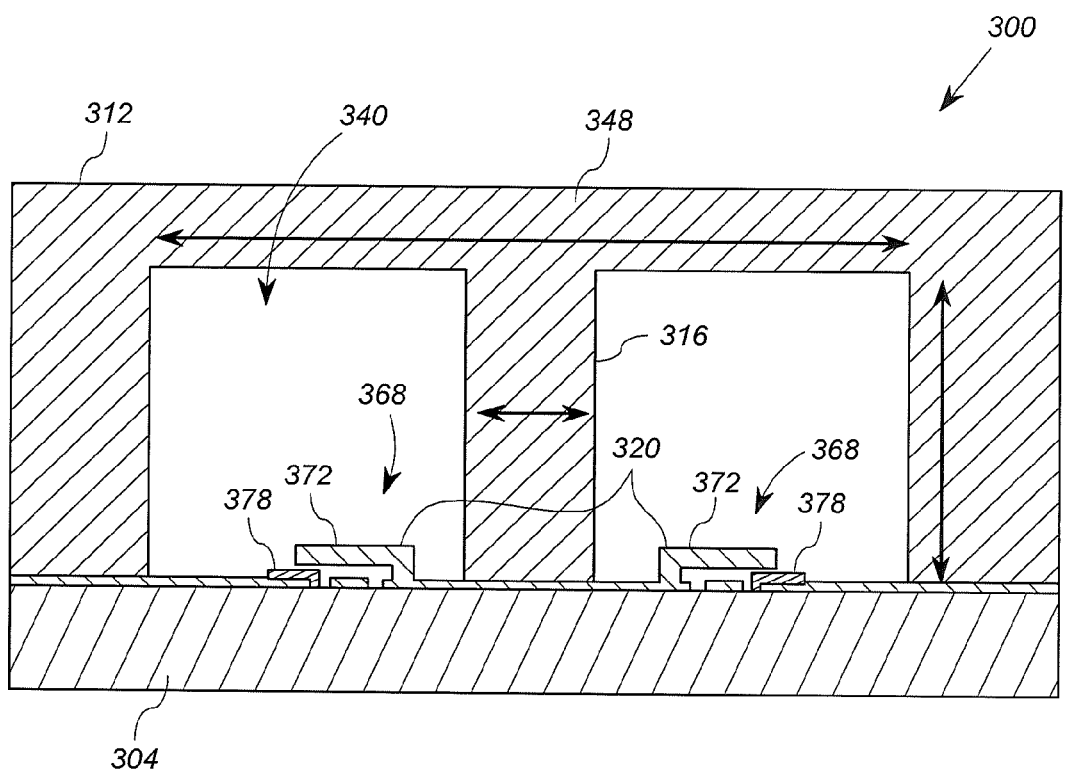
FIG. 7 is a block diagram cross sectional view of the cavity resonator of FIG. 6.

As shown in FIGS. 6 and 7, another embodiment of a tunable cavity resonator 300 includes a substrate 304, a cap structure 312, an evanescent post 316, and a controllably variable capacitive coupling shown as a tuning assembly 320. The substrate 304 is formed from silicon and includes a metalized layer 322 (FIG. 6) formed thereon.

The cap structure 312 defines a resonator cavity 340. The resonator cavity 340 is a substantially hollow-cylinder shaped cavity. The volume and shape of the resonator cavity 340 contributes in part to establishing a resonate frequency of the cavity resonator 300. The cap structure 312 further includes an input lead 336 and an output lead 338 as shown in FIG. 6. The input lead 336 and the output lead 338 are shorted coplanar waveguide ("CPW") transmission lines.

The evanescent post 316 is located within the resonator cavity 340. The evanescent post 316 extends from the substrate 304 to a ceiling portion 348 of the cap structure 312. The evanescent post 316 is substantially cylindrical and defines a first diameter near the ceiling portion 348 (see FIG.

7) and a second diameter, which is less than the first diameter, near the substrate 304. In one embodiment, the cap structure 312 is formed from metal, such as copper, and the evanescent post 316 and the resonator cavity 340 are machined from the cap structure.

Figure 8:
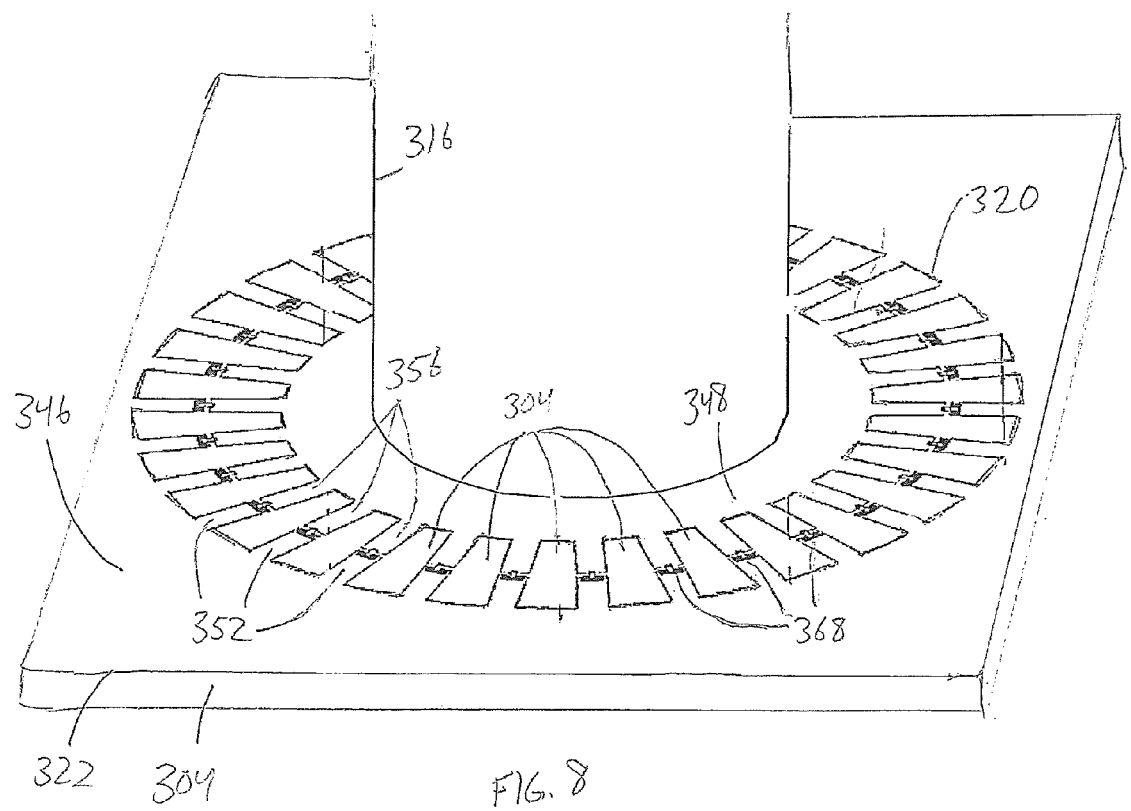
FIG. 8 is a perspective view of a portion of the cavity resonator of FIG. 6.

As shown in FIGS. 7 and 8, the tuning assembly 320 is connected to the substrate 304 in a location that is spaced apart from the evanescent post 316. The tuning assembly 320 (FIG. 8) includes a plurality of MEMS tuning components 368, which are connected in parallel. In one embodiment, the tuning assembly 320 includes approximately thirty of the MEMS tuning components 368.

With reference to FIG. 8, the MEMS tuning components 368 are arranged in a circular array between an outer portion 346 of the metalized layer 322 and an inner portion 348 of the metalized layer 322. In particular, the outer portion 346 of the metalized layer 322 defines a plurality of outer teeth 352 that are spaced apart from a plurality of inner teeth 356 defined by the inner portion 348 of the metalized layer 322. The metalized layer 322 is removed from between the teeth 352, 356 to expose the substrate 304. Also, as shown in FIG. 9, the outer teeth 352 are spaced apart from the inner teeth 356.

Figure 9:
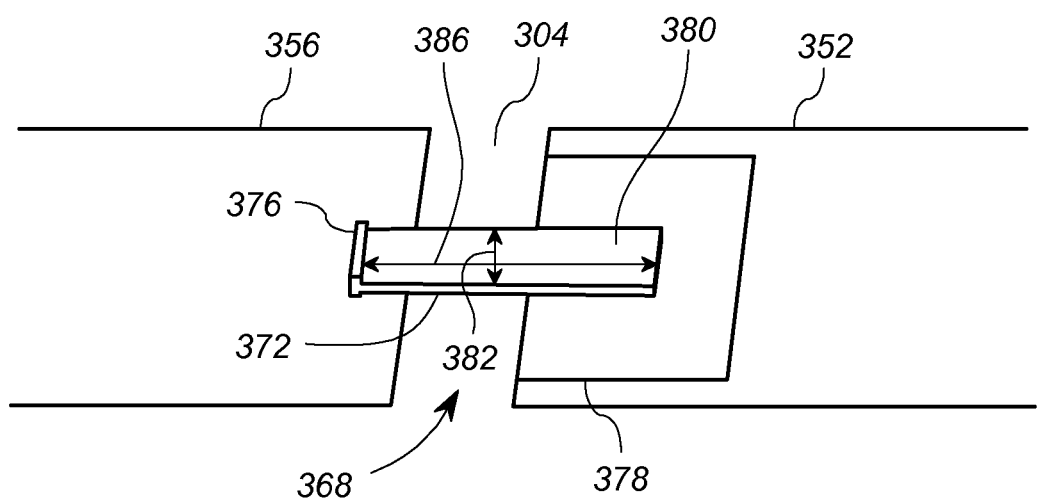
FIG. 9 is a perspective view of a MEMS tuner of the cavity resonator of FIG. 6.

As shown in FIGS. 7 and 9, the MEMS tuning components 368 each include a cantilevered beam 372 and an electrically insulating pad 378. As shown in the exemplary beam of FIG. 9, the cantilevered beam 372 includes a connected end 376 and a free end 380. The connected end 376 is connected to one of the inside teeth 356. The free end 380 extends over a corresponding one of the insulating pads 378 and a corresponding one of the outside teeth 352. The free end 376 is configured for movement relative to the insulating pad 378 and the corresponding one of the outside teeth 352. The cantilevered beam 372 is formed from or is coated with a conductive material, such as gold. In one embodiment, the cantilevered beam 372 defines a width 382 of approximately twenty micrometers of and a length 386 of approximately fifty micrometers.

The insulating pad 378 is positioned between the outside tooth 352 and the free end 380. The insulating pad 378 defines a substantially rectangular periphery. The insulating pad 378 is formed from a dielectric material, such as $Si_3N_4$ having a thickness of approximately two hundred nanometers.

As shown in FIG. 6, the cavity resonator 300 further includes a tuning network 384 that is electrically coupled to the tuning assembly 320. In particular, the tuning network 384 is electrically connected to the substrate 304 by an electrically conductive path 388 and to the metalized layer 322 by an electrically conductive path 390.

The tuning network 384 is configured to generate a tuning signal. The tuning signal is a DC voltage signal having a controllably variable voltage magnitude. In particular, the voltage magnitude of the tuning signal ranges from approximately ten volts to two hundred volts. Typically, the tuning signal is applied to the substrate 304 and the metalized layer 322 is grounded. The cavity resonator 300 does not include a DC biasline that connects the tuning network 384 directly to MEMS tuning component 368. Instead the metalized layer 322 and the substrate 304 are used to couple the tuning signal to the MEMS tuning components 368.

The tuning signal generated by the tuning network 384 is configured to cause the free end 380 of the cantilevered beams 372 to move from a deactivated position to an activated position. When the tuning signal is not applied to the tuning assembly 320 the free ends 380 of the MEMS tuning components 368 are spaced apart from the insulating pad 378 in a position referred to herein as a deactivated position. In one embodiment, in the deactivated position the free end 380 is positioned approximately 1.5 micrometers from the insulating pad 378.

When the tuning signal is applied to the tuning assembly 320, a voltage potential difference is formed between the cantilevered beams 372 and the portion of the substrate between the inner teeth 356 and the outer teeth 352. The voltage potential difference causes the free ends 380 of the cantilevered beams 372 to move toward the insulating pad 378, to the activated position. The cantilevered beams 372 are therefore caused to move in response to electrostatic forces between the cantilevered beams and the substrate 304. The insulating pad 378 is configured to prevent contact between the free ends 380 and the outer teeth 352. Additionally, the insulating pad 378 defines an area that prevents arcing between the free ends 380 and the outer teeth 352. The free ends 380 are controllably moveable within a range of movement between the deactivated position and the activated position based on the magnitude of the tuning signal.

The movement of the free ends 380 is used to controllably vary a capacitance exhibited by the tuning assembly 320 for tuning a resonate frequency of the cavity resonator 300. In the illustrated embodiment, the MEMS tuning components 368 are all substantially the same size and shape and are formed from the same material. Accordingly, in response to a particular magnitude of voltage from the tuning signal, the free ends 380 all move substantially the same distance toward the insulating pads 378. In another embodiment (not shown), a first subset of the cantilevered beams defines a first length and a second subset of the cantilevered beams defines a second longer length. The different lengths of the cantilevered beams causes the beams to react differently in response to the voltage magnitude of the tuning signal, such that in response to a first voltage magnitude the first subset of the cantilevered beams remains in the deactivated position while the second subset of the cantilevered beams is moved to the activated position. In one embodiment, each cantilevered beam 372 defines a corresponding voltage magnitude that causes the beam to move to the activated position, and the corresponding voltages are different from each other.

Figure 10:
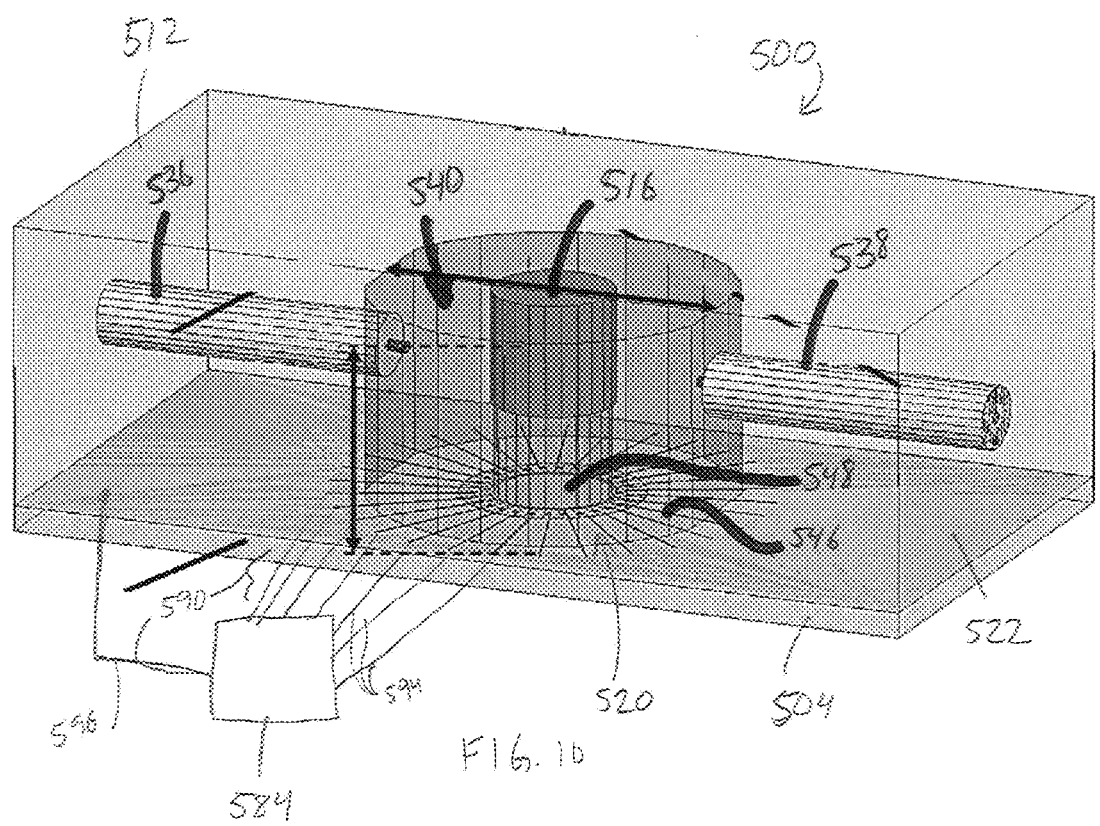
FIG. 10 is a perspective view of another embodiment of the cavity resonator of FIG. 1.

As shown in FIG. 10, another embodiment of a tunable cavity resonator 500 includes a substrate 504, a cap structure 512, an evanescent post 516, and a controllably variable capacitive coupling shown as a tuning assembly 520. The substrate 504 is formed from an electrically insulating material such as quartz, glass, gallium arsenide ("GaAs"). Accordingly, the substrate 504 is not a semiconductor material. The substrate 504 includes a metalized layer 522 formed thereon.

The cap structure 512 defines a resonator cavity 540. The resonator cavity 540 is a substantially hollow-cylinder shaped cavity. The volume and shape of the resonator cavity 540 contributes in part to establishing a resonate frequency of the cavity resonator 500. The cap structure 512 further includes an input lead 536 and an output lead 538. The input lead 536 and the output lead 538 are shorted coplanar waveguide ("CPW") transmission lines.

The evanescent post 516 is located within the resonator cavity 540. The evanescent post 516 extends from the substrate 504 to the cap structure 512. The evanescent post 516 is substantially cylindrical.

The tuning assembly 520 is connected to the substrate 504 in a location that is spaced apart from the evanescent post 516. The tuning assembly 520 includes a plurality of MEMS tuning components 568 (one of which is shown in FIG. 11), which are connected in parallel.

The MEMS tuning components 568 are arranged in a circular array between an outer portion 546 of the metalized layer 522 and an inner portion 548 of the metalized layer 522. In particular, the outer portion 546 of the metalized layer 522 defines a plurality of outer teeth 552 (one of which is shown in FIG. 11) that are spaced apart from a plurality of inner teeth 556 (one of which is shown in FIG. 11) defined by the inner portion 548 of the metalized layer 522. The metalized layer 522 is removed from between the teeth 552, 556 to expose the substrate 504. Also, as shown in FIG. 11, the outer teeth 552 are spaced apart from the inner teeth 556.

Figure 11:
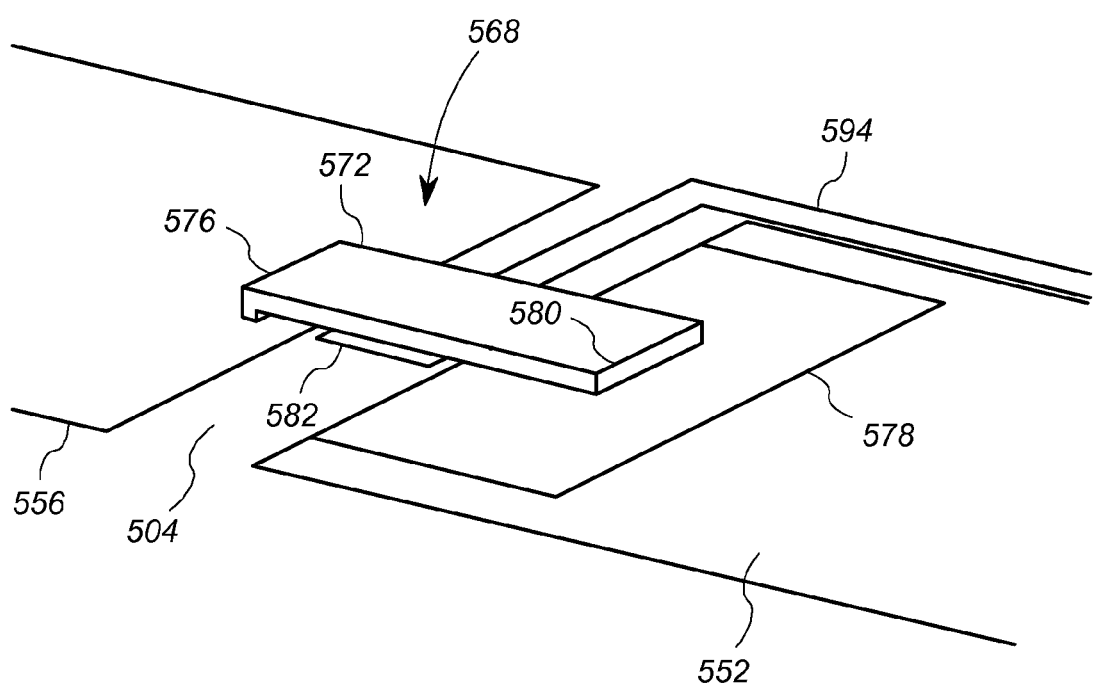
FIG. 11 is a perspective view of a MEMS tuner of the cavity resonator of FIG. 10.

With reference to FIG. 11, an exemplary one of the MEMS tuning components 568 includes a cantilevered beam 572, an electrically insulating pad 578, and an electrode 582. The cantilevered beam 572 includes a connected end 576 and a free end 580. The connected end 576 is connected to one of the inside teeth 556. The free end 580 extends over a corresponding one of the insulating pads 578 and a corresponding one of the outside teeth 552. The free end 580 is configured for movement relative to the insulating pad 578 and the corresponding one of the outside teeth 552. The cantilevered beam 572 is formed from or is coated with a conductive material, such as gold.

The insulating pad 578 is positioned between the outside tooth 552 and the free end 580. The insulating pad 578 defines a substantially rectangular periphery. The insulating pad 578 is formed from an electrically insulating material, such as silicon dioxide.

The electrode 582 is positioned on the substrate 504 between the outside tooth 556 and the inside tooth 552. The electrode 582 is positioned between the substrate 504 and the cantilevered beam 572. The electrode 582 is formed from the same material as the metalized layer.

With reference again to FIG. 10, the cavity resonator 500 further includes a tuning network 584 that is electrically coupled to the tuning assembly 520 by a reactive DC biasline 590. The tuning network 584 is configured to generate a DC tuning signal that is substantially the same as the tuning signal generated by the tuning network 384 of FIG. 6. The magnitude of the tuning signal, in one embodiment, ranges from fifty volts to over two hundred volts.

The DC biasline 590 includes a plurality of electrically isolated conducting paths 594, 596. Some of the conducting paths 594 electrically couple the tuning network to the electrodes 582 of the MEMS tuning components 568. Another conducting path 596 electrically couples the tuning network 584 to the metalized layer 522.

The free ends 580 of the cantilevered beams 572 are movable between a deactivated position and an activated position by the tuning network 584. In particular, when the tuning network 584 is prevented from generating the tuning signal, the free ends 580 of the cantilevered beams 572 are positioned in a deactivated position (as shown in FIG. 11). When the tuning signal is electrically coupled to the conducting paths 590 an electric potential difference is established between the free ends 580 and the electrodes 582, which causes the free ends to move toward the insulating pad 578 to an activated position. The movement of the free ends 580 is used to controllably vary a capacitance exhibited by the tuning assembly 520 for tuning a resonant frequency of the cavity resonator 500. Additionally, since the conducting paths 590 are electrically isolated from each other, the tuning assembly 520 is configurable to couple the tuning signal to a desired subset of the conducting paths so that only the desired subset of the MEMS tuning components 568 are activated.

The DC biasline 590 is based purely on inductive-reactance as opposed to resistance. Accordingly, when a reactive DC biasline 590 is used, less power is lost due to the resistance of the DC biasline being very low. An issue with using a DC biasline based on resistance is that power is still dissipated as heat. In a reactive DC biasline 590, very little power is dissipated as heat due to the small resistance of the DC biasline. By relying on reactance, the impact of the DC biasline 590 on the electromagnetic performance of the cavity resonator 500 is drastically reduced.

The foregoing detailed description of one or more embodiments of the cavity resonator 100 has been presented herein by way of example only and not limitation. Moreover, there are advantages to individual advancements described herein that may be obtained without incorporating other aspects described above. Therefore, the spirit and scope of the appended claims should not be limited to the description of the preferred embodiments contained herein.

What is claimed is:

1. A tunable cavity resonator comprising:
   a housing defining an interior, the housing having at least one sidewall, a first end, and a second end;
   a post within the interior connecting the first end to the second end, the post and the housing defining a resonating cavity; and
   a controllably variable capacitive coupling disposed in the housing.

2. The tunable cavity resonator of claim 1, wherein:
   the housing defines a gap space, and
   the controllably variable capacitive coupling is at least partially located in the gap space.

3. The tunable cavity resonator of claim 2, wherein the gap space is disposed in the first end.

4. The tunable cavity resonator of claim 3, wherein:
   the first end defines a generally circular periphery,
   the first end defines a radially inner end portion spaced apart from a radially outer end portion, and
   the gap space is positioned between the radially inner end portion and the radially outer end portion.

5. The tunable cavity resonator of claim 4, wherein:
   the post defines a post impedance,
   the controllably variable capacitive coupling defines a controllably variable capacitance, and
   the post is in series with the controllably variable capacitance.

6. The tunable cavity resonator of claim 1, wherein:
   the controllably variable capacitive coupling includes a plurality of tuning components configured to exhibit a controllably variable capacitance, and
   the plurality of tuning components includes a plurality of varactors configured to exhibit the controllably variable capacitance.

7. The tunable cavity resonator of claim 1, wherein:
   the controllably variable capacitive coupling includes a plurality of tuning components configured to exhibit a controllably variable capacitance,
   the plurality of tuning components includes a plurality of MEMS beams configured for controllable movement relative to the first end, and
   the plurality of MEMS beams exhibit the controllably variable capacitance.

8. The tunable cavity resonator of claim 1, further comprising:
   a tuning network spaced apart from the resonating cavity, the tuning network being configured to generate a DC tuning signal for controlling the controllably variable capacitive coupling.

9. The tunable cavity resonator of claim 8, further comprising:
   a DC biasline electrically coupled to the tuning network and to the controllably variable capacitive coupling.

10. A tunable cavity resonator comprising:
a substrate;
a cap structure extending from the substrate, at least one of the substrate and the cap structure at least partially defining a resonator cavity;
a post structure at least partially located within the resonator cavity and extending from the substrate to the cap structure, the post structure defining a post impedance; and
a capacitive tuning assembly connected to the cap structure and spaced apart from the post structure, the capacitive tuning assembly defining a tuning assembly capacitance, the tuning assembly configured to controllably tune the tuning assembly capacitance between a first tuning capacitance and a second tuning capacitance,
wherein a resonant frequency of the tunable cavity resonator is based on the tuning assembly capacitance and the post impedance.

11. The tunable cavity resonator of claim 10, wherein:
the cap structure defines a gap space between a first cap structure portion and a second cap structure portion,
the capacitive tuning assembly is at least partially located in the gap space, and
the tuning assembly capacitance is in series with the post impedance.

12. The tunable cavity resonator of claim 11, wherein:
the capacitive tuning assembly includes a plurality of tuning components,
the tuning components exhibit a first capacitance at the first tuning capacitance and a second capacitance at the second tuning capacitance.

13. The tunable cavity resonator of claim 12, wherein the plurality of tuning components are connected in parallel.

14. The tunable cavity resonator of claim 13, further comprising:
a tuning network electrically connected to the substrate and to the capacitive tuning assembly, and configured to generate a tuning signal for tuning the plurality of tuning components of the capacitive tuning assembly.

15. The tunable cavity resonator of claim 14, wherein:
the tuning network is electrically connected to each tuning component of the plurality of tuning components, and
the tuning network is configured to individually tune each tuning component of the plurality of tuning components.

16. The tunable cavity resonator of claim 15, wherein the plurality of tuning components includes a plurality of varactors configured to exhibit a controllable capacitance.

17. A tunable cavity resonator comprising:
a substrate;
a cap structure extending from the substrate, at least one of the substrate and the cap structure defining at least partially a resonator cavity, the cap structure including a first portion spaced apart from a second portion by a gap space,
a post structure extending between the substrate and the first portion of the cap structure, the post structure defining a post impedance,
a capacitive tuning assembly including a plurality of tuning components at least partially located in the gap space, the capacitive tuning assembly defining a tuning assembly capacitance, and the capacitive tuning assembly configured to controllably tune the tuning assembly capacitance between a first tuning capacitance and a second tuning capacitance,
wherein a resonant frequency of the tunable cavity resonator is based on the tuning assembly capacitance and the post impedance.

18. The tunable cavity resonator of claim 17, wherein:
the gap space is substantially ring-shaped,
the post is substantially cylindrical, and
the plurality of tuning components are each located a radial distance from the post.

19. The tunable cavity resonator of claim 18, wherein the gap space is in fluid communication with the cavity.

20. The tunable cavity resonator of claim 19, wherein the post impedance is substantially inductive.

\* \* \* \* \*